United States Patent [19]
Nakazato

[11] Patent Number: 5,768,775
[45] Date of Patent: Jun. 23, 1998

[54] MOUNTING APPARATUS OF CONDUCTIVE BALLS AND MOUNTING METHOD THEREOF

[75] Inventor: Shinichi Nakazato, Fukuoka, Japan

[73] Assignee: Matsushita Electric Industrial Co., Ltd., Osaka, Japan

[21] Appl. No.: 701,839

[22] Filed: Aug. 23, 1996

[30] Foreign Application Priority Data

Aug. 24, 1995 [JP] Japan .................................... 7-215877

[51] Int. Cl.$^6$ ............................... H01R 9/06; B23K 3/00
[52] U.S. Cl. .............................. 29/843; 228/41; 228/245; 228/246; 427/97
[58] Field of Search ............................. 29/840, 740, 843; 228/179, 180.21, 180.22, 245, 246; 427/97

[56] References Cited

U.S. PATENT DOCUMENTS

| | | |
|---|---|---|
| 5,431,332 | 7/1995 | Kirby et al. . |
| 5,464,652 | 11/1995 | Himmel et al. . |
| 5,626,277 | 5/1997 | Kawada . |
| 5,651,180 | 7/1997 | Himmel et al. . |

FOREIGN PATENT DOCUMENTS

| | | |
|---|---|---|
| 62-166548 | 7/1987 | Japan . |
| 5-129374 | 5/1993 | Japan . |
| 5-299424 | 11/1993 | Japan . |
| 7-170059 | 7/1995 | Japan . |
| 7-202402 | 8/1995 | Japan . |

*Primary Examiner*—Carl J. Arbes
*Attorney, Agent, or Firm*—Ratner & Prestia

[57] ABSTRACT

A mounting head is composed of a box-shaped main body, a case contained inside the main body, and a suction tool in the lower part of the case. The main body and case are coupled by a spring member, and the weight of the suction tool is canceled by the force of the spring. A cylinder is provided in the main body, and a rod is coupled to the case and cylinder. Solder balls sucked in by a vacuum into suction holes of the suction tool are pressed onto the electrodes of a workpiece by the cylinder. The mounting head is moved up and down by elevating means comprising a ball screw, a nut, and a motor. The pressing force of the suction tool by the cylinder is set to a proper magnitude so that the solder balls are not squeezed or crushed into the electrodes or sink into the suction holes of the suction tool.

10 Claims, 3 Drawing Sheets

MOUNTING APPARATUS OF CONDUCTIVE BALLS AND MOUNTING METHOD THEREOF

BACKGROUND OF THE INVENTION

The present invention relates to a mounting apparatus of conductive balls used in a manufacturing process of bumped work, and a mounting method thereof.

In a manufacturing process of bumped work such as flip chips,, as the method of forming bumps on work electrodes (protruded electrodes), a method of using conductive balls such as solder balls is known. In this method, after mounting solder balls on the work electrodes, the solder balls are heated, fused and solidified to form bumps.

FIG. 4 is a partial sectional view of a suction tool of a conventional mounting apparatus of conductive balls. Solder balls 1 as conductive balls are sucked in vacuum in multiple suction holes 4 formed in the lower surface of a box-shaped suction tool 3. The lower surface of the solder balls 1 is coated with flux 2 in a preceding process. By lowering the suction tool 3 by driving elevating means comprising feed screw, nut, motor and others, the solder balls 1 are landed on the electrodes 6 of the work 5 as shown in FIG. 4. Accordingly, by raising the suction tool 3 after canceling the vacuum suction state, the solder balls 1 are mounted on the work 5. The work 5 is consequently sent into a heating oven, and the solder balls 1 are heated, fused and solidified, and bumps are formed.

In such conventional means, however, since the solder balls 1 are landed on the electrodes 6 of the work 5 by lowering the suction tool 3, the solder balls 1 may be crushed due to the pressurizing force F at the time of landing, or the solder balls 1 may be fitted firmly into the suction holes 4, and when the suction tool 3 is raised by canceling the vacuum suction state, the solder balls 1 may not be mounted on the electrodes 6, but remain fitted in the suction holes 4.

SUMMARY OF THE INVENTION

It is hence an object of the invention to provide a mounting apparatus of conductive balls capable of mounting conductive balls such as solder balls sucked in vacuum by a suction tool securely on electrodes of a work, and a mounting method thereof.

In the invention, a mounting head of a mounting apparatus of conductive balls is composed of a main body, a suction tool provided below the main body forming suction holes of conductive balls in its lower surface, pressing means for pressing the suction tool downward, and a spring member for pushing the suction tool upward elastically and canceling the own weight of the suction tool side by its spring force, wherein the force of pressing the conductive balls to the electrodes of the work is set by the pressing force of the pressing means. Preferably, the spring force of the spring member is equal to the own weight of the suction tool side.

The mounting method of conductive balls of the invention comprises a step of lowering the suction tool sucking in vacuum the conductive balls in the suction holes formed in the lower surface by driving elevating means, and landing the conductive balls on the electrodes, a step of slightly elevating the suction tool to lift the conductive balls slightly from the electrodes by inserting flux between the conductive balls and electrodes, and a step of canceling the vacuum suction state, elevating the suction tool, and landing the conductive balls again on the electrodes by the adhesive force of the flux, thereby mounting.

According to this constitution, the conductive balls can be securely mounted on the electrodes by pressing with an appropriate force set by pressing means. Moreover, by slightly elevating after landing the conductive balls on the electrodes of the work, an adhesive force of the flux is built up between the electrodes and conductive balls, so that the conductive balls can be securely mounted on the electrodes by this adhesive force.

DESCRIPTION OF THE PREFERRED EMBODIMENT

Figure 1:
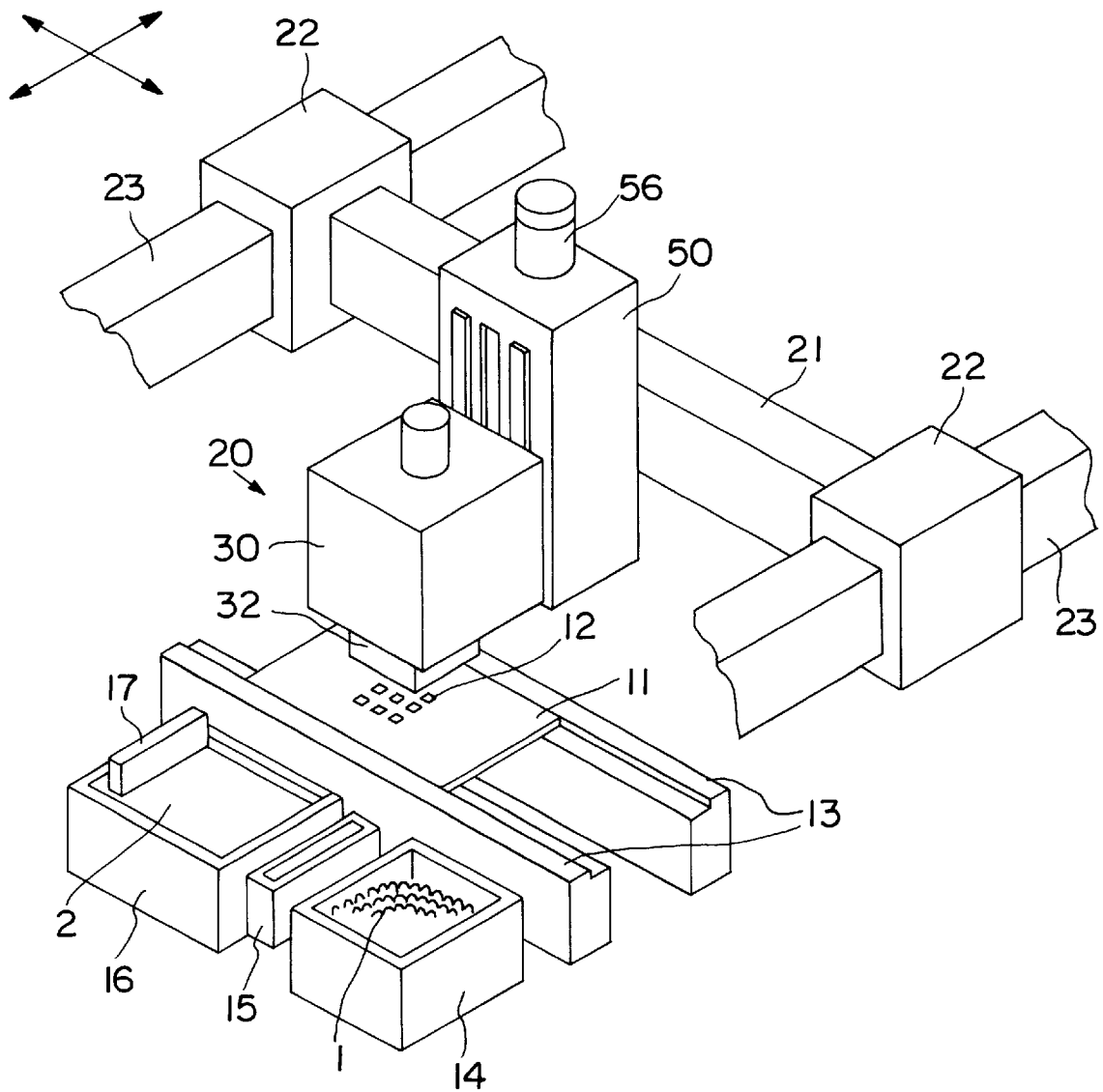
FIG. 1 is a perspective view of a mounting apparatus of conductive balls in an embodiment of the invention.

In FIG. 1, a guide rail 13 mounting a work 11 is a positioning part for clamping and positioning the work 11. On the upper surface of the work 11, a multiplicity of electrodes 12 for mounting solder balls 1 as conductive balls are formed. Beside the guide rail 13 are installed a feeder 14 of solder balls 1, a light source 15 for detection of suction error, and a container 16 of flux. A squeegee 17 smoothes the liquid surface of the flux. The feeder 14 is a box, in which solder balls 1 are stored.

Above the guide rail 13 is provided a mounting head 20. The mounting head 20 moves in the X-direction along a guide shaft 21. Both ends of the guide shaft 21 are coupled with a guide shaft 23 through a slider 22, and the guide shaft 21 moves in the Y-direction along the guide shaft 23. That is, the guide shafts 21, 23 are moving means for moving the mounting head 20 in the X-direction or Y-direction. The operating power system for moving the mounting head 20 along the guide shafts 21, 23 is not shown.

Figure 2:
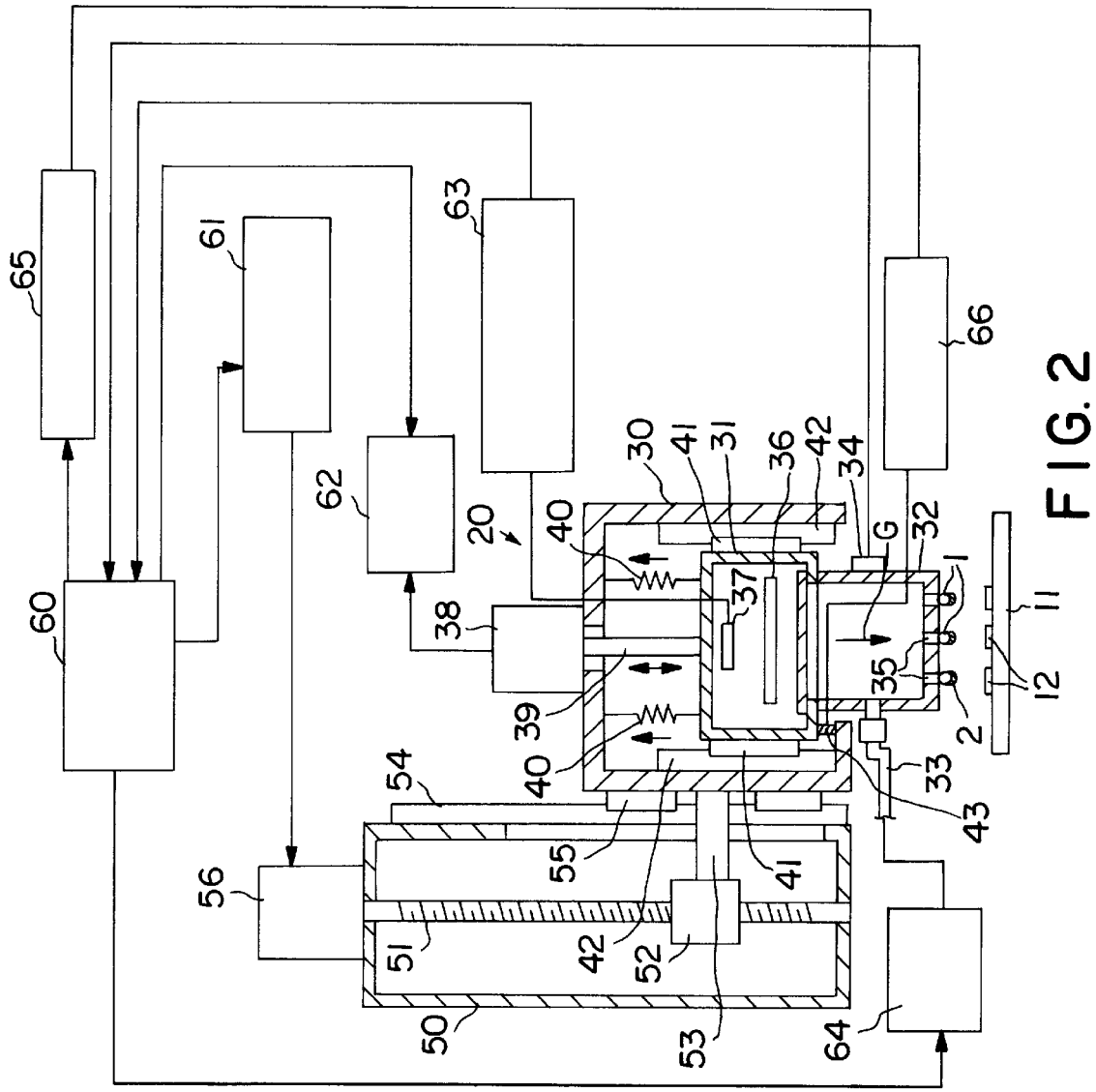
FIG. 2 is a sectional view of a mounting head of the mounting apparatus shown in FIG. 1.
Figure 3A:
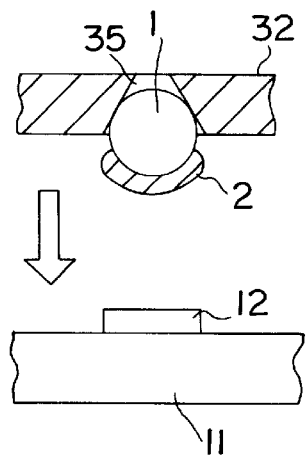
FIG. 3 (*a*), FIG. 3 (*b*), FIG. 3 (*c*), and FIG. 3 (*d*) are explanatory diagrams of mounting operation of conductive balls in the mounting apparatus shown in FIG. 1.
Figure 3B:
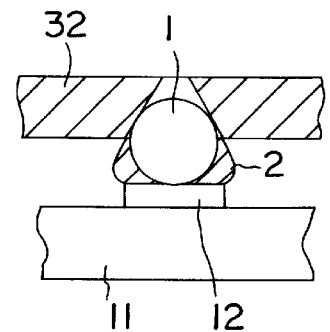
Figure 3C:
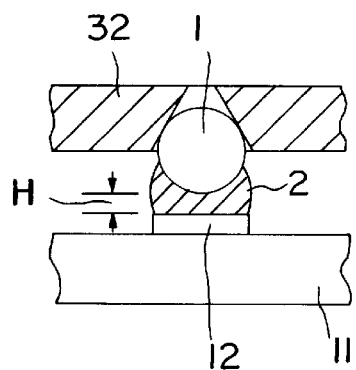
Figure 3D:
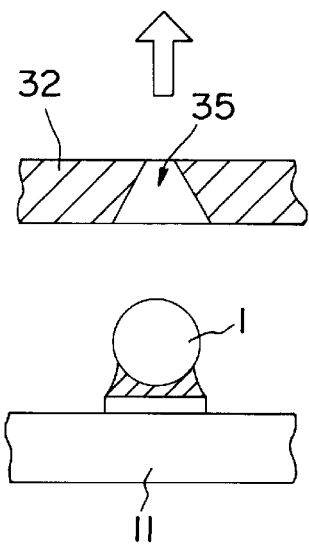
Figure 4:
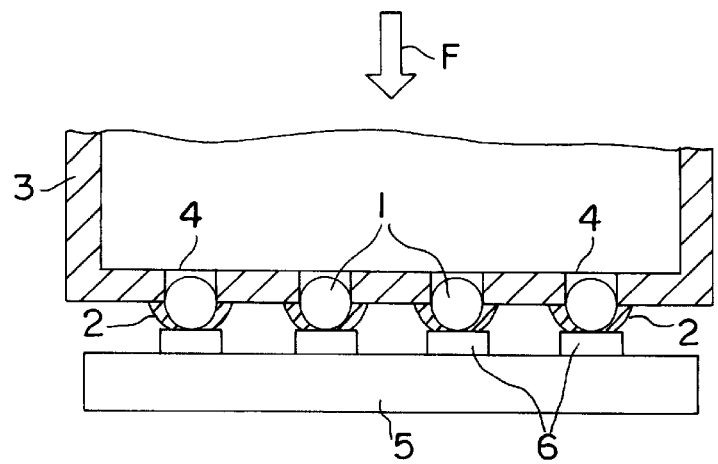
FIG. 4 is a partial sectional view of a suction tool of a conventional mounting apparatus of conductive balls.

Referring now to FIG. 2, the structure of the mounting head 20 is described. The box 30 as the main body has no bottom, and a case 31 is contained inside. A box-shaped suction tool 32 is coupled to the lower part of the case 31. The suction tool 32 is connected to a suction unit 64 through a tube 33, and as the suction unit 64 operates, solder balls 1 are sucked in vacuum to a multiplicity of suction holes 35 formed in the lower part.

Inside the case 31, there are a focusing element 36 and a photo detection sensor 37. A cylinder 38 is mounted on the case 31, and the case 31 is coupled to the lower end of its rod 39. A spring member 40 couples the ceiling side of the box 30 and upper side of the case 31. By its spring force, the spring member 40 elastically pushes the case 31 upward to cancel the own weight G of the suction tool 32 side. In this embodiment, the spring force of the spring member 40 is equal to the own weight G of the case 31 and suction tool 32. Sliders 41 provided at both sides of the case 31 are slidably fitted to vertical rails 42 provided inside the box 30. A touch sensor 43 is provided in the bottom of the box 30.

The elevating means of the box 30 is described. A vertical ball screw 51 is contained inside a slender drive case 50 provided at the side of the box 30. A nut 52 is engaged with the ball screw 51, and the nut 52 is coupled with the box 30 through a rod 53. At the side of the drive case 50, a vertical rail 54 is provided, and a slider 55 provided on the side of the box 30 is slidably fitted to the rail 54. As a motor 56 drives to rotate the ball screw 51, the nut 52 moves up and down along the ball screw 51. As a result, the box 30 and suction tool 32 are moved up and down.

A control unit 60 controls a motor drive circuit 61, a pressing force control unit 62, a suction error detecting circuit 63, a suction unit 64, and a vibrator drive circuit 65, and receives a signal from a touch detecting circuit 66 connected to the touch sensor 43. The motor drive circuit 61 control the motor 56. The pressing force control unit 62 controls the cylinder 38. The suction error detecting circuit 63 detects presence or absence of suction error by signal from the photo detecting sensor 37. As shown in FIG. 2, a vibrator 34 to be controlled by the vibrator drive circuit 65 is provided at the side of the suction tool 32, and the suction tool 32 is vibrated by ultrasonic waves.

The mounting device of conductive balls is thus constituted, and its operation is described below. In FIG. 1, the mounting head 20 moves above the feeder 14. As the motor 56 (FIG. 2) is driven, the mounting head 20 descends or ascends, and solder balls 1 are sucked in vacuum and picked up to the suction holes 35 at the lower side of the suction tool 32.

The mounting head 20 then moves above the container 16. On its way, the mounting head 20 passes above the light source 15. The light source 15 emits light toward the lower side of the suction tool 32, and unless solder balls 1 are sucked in vacuum to any one of the suction holes 35 in FIG. 2, the light passes through the suction hole 35 and enters the photo detecting sensor 37, so that a suction error is judged. In the event of a suction error, the mounting head 20 is moved back above the feeder 14, and repeats the pickup action.

In the absence of suction error, the mounting head 20 moves above the container 16, and the motor 56 is driven to move up and down, and the lower side of the solder balls 1 is coated with flux 2 stored in the container 16. In consequence, the mounting head 20 moves above the work 11, and descends and ascends, and the solder balls 1 are mounted on the electrodes 12 of the work 11.

FIG. 3 (a), FIG. 3 (b), FIG. 3 (c), and FIG. 3 (d) show the detail of mounting operation of solder balls 1. First, as shown in FIG. 3 (a), the suction tool 32 descends toward the work 11. This descending action is done by normal rotation of the motor 56.

When the solder balls 1 land on the electrodes 12 as shown in FIG. 3 (b), by reaction as shown in FIG. 2, the suction tool 32 is slightly lifted from the box 30 while pushing upward the rod 39 of the cylinder 38, and the bottom of the case 31 is departed from the touch sensor 4, so that landing of balls 1 on the electrodes 12 is detected, and the motor 56 is immediately stopped, and descending motion of the suction tool 32 stops.

As shown in FIG. 3 (b), in the state of landing of solder balls 1 on the electrodes 12, the descending force by normal rotation of the motor 56 does not act as the force of pushing the solder balls 1 toward the electrodes 12. This is because, once the solder balls 1 land on the electrodes 12, the case 31 and suction tool 32 are lifted from the bottom of the box 30, and the descending force by normal rotation of the motor 56 is not transmitted to the suction tool 32. Besides, the own weight of the case 31 or suction tool 32 does not act as pushing force. This is because the own weight of the case 31 or suction tool 32 is canceled by the upward spring force of the spring member 40. Therefore, only the pressing force applied when the cylinder 38 operates and its rod 39 projects downward acts as the force of pushing the solder balls 1 to the electrodes 12. That is, the cylinder 38 is pressing means of the suction tool 32 for pushing the solder balls 1 to the electrodes 12 with a proper force, and this pressing force sets the magnitude of the force of pushing the solder balls 1 to the electrodes 12 of the work 11. Therefore, by controlling the projecting force of the rod of the cylinder 38, the solder balls 1 can be pressed to the electrodes 12 with a proper force, that is, with a force of adequate magnitude not to sink or crush the solder balls 1 into the suction holes 35.

Consequently, by reversely rotating the motor 56 slightly, the suction tool 32 is lifted to a slight height H (about 0.1 to 0.15 mm). Incidentally, the diameter of the solder ball 1 in the embodiment is about 1 mm. Hence, the lower side of the solder balls 1 is slightly lifted from the electrodes 12 by about 0.1 to 0.15 mm, and an adhesive flux 2 is interposed between the solder balls 1 and electrodes 12 (FIG. 3 (c)). Accordingly, by canceling the vacuum suction state of the solder balls 1 and rotating the motor 56 reversely to raise the suction tool 32, the solder balls 1 are departed from the suction holes 35, and land again on the electrodes 12 to be mounted (FIG. 3 (d)). In this case, since the solder balls 1 are sucked to the electrodes 12 by the adhesion of the flux 2, by raising the suction tool 32, the balls 1 are securely departed from the suction holes 35 and are mounted on the electrodes 12. When the solder balls 1 are departed from the suction holes 35, by driving the vibrator 34 and vibrating the suction tool 32 by ultrasonic waves, the solder balls 1 are securely departed from the suction holes 35.

In this way, when the solder balls 1 are mounted on the work 11, the work 11 is sent out to next process along the guide rail 13. Successively, a new work 11 is sent into the guide rail 13, and the same operation is repeated.

The invention is not limited to the illustrated embodiment alone. For example, the flux 2 may be applied on the electrode 12 of the work 11 by dispenser, screen printing press or other means, instead of being deposited on the lower side of the solder balls 1.

According to the invention, the conductive balls can be landed on the electrodes of the work with an appropriate force, and mounted securely. Moreover, by slightly raising after landing the conductive balls on the electrodes of the work, an adhesive force of flux is generated between the electrodes and conductive balls, so that the conductive balls can be securely mounted on the electrodes by this adhesive force.

What is claimed is:

1. A mounting method for mounting conductive balls on a workpiece having electrodes by using a mounting apparatus comprising a head body, moving means for moving said head body up and down, a suction tool for sucking conductive balls at a lower side of said suction tool, said suction tool slidably coupled to said head body, pulling means providing a pulling force for pulling said suction tool in an upward direction, said pulling means provided within said head body, pressing means providing a pressing force for pressing said suction tool in an downward direction, said pressing means provided within said head body, and control means for controlling said pressing force, said mounting method comprising the steps of:

(a) sucking conductive balls into said suction tool;
   (b) lowering said suction tool toward said workpiece;
   (c) placing the conductive balls on the electrodes of said workpiece;

(d) pressing said suction tool toward said workpiece using the pressing force of said pressing means; and (e) controlling the pressing force of said pressing means.

2. A mounting method of claim 1, further comprising the steps of:

(f) sensing the placement of the conductive balls on the electrodes; and (g) stopping a downward motion of said head body upon sensing the placement of step (f).

3. A mounting method of claim 1, furtherer comprising the steps of:

(f) lifting the conductive balls from the electrodes, with flux interposed between the conductive balls and the electrodes, by raising said suction tool, after said pressing step;

(g) mounting the conductive balls on the electrodes by using an adhesive force of the flux; and (h) raising said suction tool away from said workpiece.

4. A mounting method of claim 1, wherein step (e) comprises the steps of:

(e1) sensing the placement of the conductive balls on the electrodes;

(e2) determining the pressing force exerted on the conductive balls; and (e3) transmitting signals to control the pressing force responsive to the determination of Step (e2).

5. A mounting apparatus for mounting conductive balls on a workpiece having electrodes, said apparatus comprising:

a head body;

moving means for moving up and down said head body;

a suction tool for sucking conductive balls at a lower side of said suction tool, said suction tool slidably coupled to said head body;

pulling means providing a pulling force for pulling said suction tool in an upward direction, provided with said head body;

pressing means providing a pressing force for pressing said suction tool in a downward direction, said pressing means provided within said head body; and control means for controlling said pressing force.

6. A mounting apparatus of claim 5, wherein the pulling force of said pulling means is substantially equal to a weight of said suction tool.

7. A mounting apparatus of claim 5, further comprising sensing means for sensing placement of the sucked conductive balls on the electrodes of said workpiece.

8. A mounting apparatus of claim 5, further comprising a control unit for signaling said pressing means to press said suction tool in the downward direction to place the sucked conductive balls on the electrodes of said workpiece.

9. A mounting apparatus of claim 8, wherein said pressing means provides a feedback signal to said control unit, and said control unit signals said pressing means to control said pressing force responsive to the feedback signal.

10. A mounting apparatus of claim 8, further comprising a pressing force controller coupled to said control unit, said control unit providing a signal to said pressing force controller so that said pressing force controller controls the pressing force responsive to the further signal.

\* \* \* \* \*